United States Patent [19]
Sagara et al.

[11] Patent Number: 5,118,633
[45] Date of Patent: Jun. 2, 1992

[54] METHOD FOR MANUFACTURING A BICMOS SEMICONDUCTOR DEVICE

[75] Inventors: Kazuhiko Sagara, Hachioji; Kiyoo Itoh, Higashi-Kurume; Goro Kitsukawa, Tokyo; Yoshifumi Kawamoto, Kanagawa; Yoshiki Kawajiri, Hachioji, all of Japan

[73] Assignee: Hitachi, Ltd., Tokyo, Japan

[21] Appl. No.: 557,649

[22] Filed: Jul. 25, 1990

[30] Foreign Application Priority Data

Jul. 31, 1989 [JP] Japan .................. 1-196569

[51] Int. Cl.$^5$ .................. H01L 21/331; H01L 21/336; H01L 21/225
[52] U.S. Cl. .................. 437/31; 437/34; 437/58; 437/162; 148/DIG. 144
[58] Field of Search .................. 437/31, 33, 56, 57, 437/58, 59, 162, 950, 174, 247, 41, 44, 919; 148/DIG. 3, DIG. 9, DIG. 123, DIG. 124, DIG. 144, DIG. 145; 357/34, 43

[56] References Cited

U.S. PATENT DOCUMENTS

| | | | |
|---|---|---|---|
| 3,787,962 | 1/1974 | Yoshida et al. | 437/934 |
| 3,873,373 | 3/1975 | Hill | 437/41 |
| 4,149,904 | 4/1979 | Jones | 437/41 |
| 4,182,023 | 1/1980 | Cohen et al. | 437/41 |
| 4,188,707 | 2/1980 | Asano et al. | 437/31 |
| 4,279,671 | 7/1981 | Komatsu | 437/31 |
| 4,356,623 | 11/1982 | Hunter | 437/44 |
| 4,369,072 | 1/1983 | Bakeman, Jr. et al. | 437/44 |
| 4,484,388 | 11/1984 | Iwasaki | 437/59 |
| 4,534,806 | 8/1985 | Magdo | 437/31 |
| 4,577,395 | 3/1986 | Shibata | 437/919 |
| 4,808,548 | 2/1989 | Thomas et al. | 437/44 |
| 4,818,720 | 4/1989 | Iwasaki | 437/162 |
| 4,971,926 | 11/1990 | Kinugawa | 437/919 |

FOREIGN PATENT DOCUMENTS 0283135  2/1987  European Pat. Off.

OTHER PUBLICATIONS

Grove, A. S., Physics and Technology of Semiconductor Devices, John Wiley & Sons, 1967, pp. xiii-xix, 43-58.
Nikkei Microdevices, 1988, pp. 70-71.
Iwai et al., "1.2 μm Direct Ion-Implanted . . . ", ICD 87, pp. 1-5.
Yamaguchi, T., et al., "Process Integration . . . ", IEEE Trans. Elec. Dev., vol. 36, No. 5, May 1988, pp. 890-896.

Primary Examiner—T. N. Quach
Attorney, Agent, or Firm—Antonelli, Terry, Stout & Kraus

[57] ABSTRACT

Sources and drains of MOS transistors are formed after the formation of an emitter of a bipolar transistor, whereby the sources and drains are made smaller in thickness than the emitter. Since the sources and drains are not subjected to a high-temperature heat treatment conducted in the formation of the emitter, there is no fear of increase in thickness of the sources and drains caused by the diffusion of impurities. There can be formed a BiCMOS having a high integration density and superior characteristics.

24 Claims, 9 Drawing Sheets

L1, L2 : LEVEL CONVERTER

METHOD FOR MANUFACTURING A BICMOS SEMICONDUCTOR DEVICE

BACKGROUND OF THE INVENTION

The present invention relates to a method for manufacturing a semiconductor device and more particularly to a method for manufacturing a semiconductor device capable of forming a high-performance BiCMOS LSI easily with a high accuracy.

Figure 1:
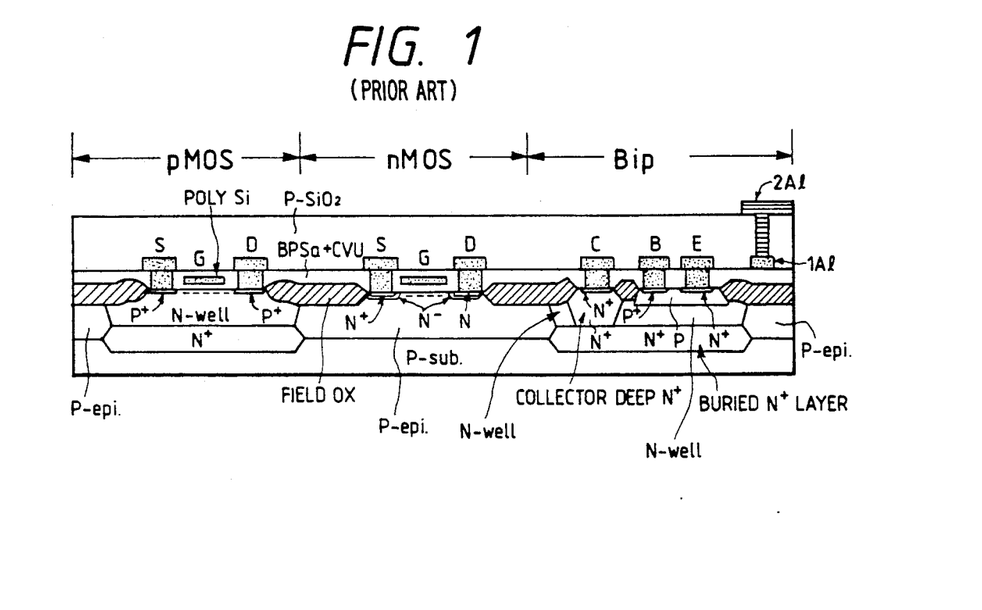
FIG. 1 is a view showing an example of a sectional structure of a conventional BiCMOS.

Conventional semiconductor devices each comprise a bipolar transistor (hereinafter referred to simply as "Bip"), an n-channel MOS transistor (simply as "nMOS" hereinafter) and a p-channel MOS transistor (simply as "pMOS" hereinafter), as described, for example, in the Institute of Electronics, Information and Communication Engineers (IEICE) Technical Report, Integrated Circuit Devices (ICD) 87-33, 1987, (see FIG. 1).

Usually, such BiCMOS is formed as follows. First, an n-type buried layer is formed in part of a p-type substrate and subsequently a p-type epitaxial layer is allowed to grow. Then, an N well is formed in the p-type epitaxial layer, and also formed is a thick silicon dioxide film for isolation by selective implantation. Then, a gate electrode is formed, and after the deposition of an insulating film, there are formed source and drain regions of each of nMOS and pMOS by a known method. Subsequently, a base and an emitter of Bip are formed, then contact holes are formed, followed by the formation of interconnection, to complete the BiCMOS LSI shown in FIG. 1.

According to the conventional manufacturing method, as is apparent from the above explanation, first a MOS transistor is formed and thereafter a bipolar transistor is formed. In many cases, moreover, the depth of emitter, xjE(Bip), is about 0.15 μm, while the depth of the source and drain regions of nMOS is about 0.20 μm, and that of the source and drain regions of pMOS is about 0.35 μm, thus there exists the relation of xj(CMOS) > xjE(Bip) wherein xj(CMOS) represents the depth of the source and drain regions of CMOS.

The above prior art involves the problem that if the transistors are made very fine, the characteristics of the MOS transistor are deteriorated so it becomes difficult to realize a BiCMOS LSI of high integration density. Also, there has been the problem that if the transistors are attenuated while retaining the relation of xj(MOS) > xjE(Bip), the characteristics of the bipolar transistor are deteriorated, thus making it impossible to realize a high-performance BiCMOS LSI.

In NIKKEI MICRODEVICES, February 1988, pp. 70-71, there are shown many BiCMOS's, in which there are included, though not many, examples of xj(CMOS) being smaller than xjB(Bip). But the details, including how to manufacture, are not shown therein at all, so it is quite uncertain whether they are practically employable or not.

Reference is also here made to IEEE Transaction on Electron Devices, Vol. 36, No. 5, May 1989, pages 890-896. In this transaction there is described a BiCMOS, in which emitter and base electrodes of Bip are formed using a two-layer polysilicon film; a gate electrode of nMOS is formed using a polysilicon film; and a gate electrode of pMOS is formed using a two-layer film comprising a titanium silicide film and a polysilicon film. If the gate electrode of pMOS formed by the two-layer film comprising a titanium silicide film and a polysilicon film is annealed at a high temperature, the boundary between the two films will be extinguished, so that the titanium silicide comes into direct contact with the gate insulating film. In this case, since the interface characteristics between the silicide and the gate insulating film is poor, such direct contact of the titanium silicide with the gate insulating film will cause leakage current to flow, leading to marked deterioration in the characteristics of pMOS. Therefore, after the formation of the titanium silicide film, it is necessary to avoid a high-temperature annealing and maintain the boundary between the above two films. To this end, in the article referred to above, after annealing at a high temperature (950° C.), a titanium silicide film is formed by deposition to constitute a gate electrode of pMOS, and thereafter source and drain regions of pMOS and nMOS are formed. The emitter thickness in the bipolar transistor formed is 0.05 μm, while the thickness of the source and drain regions of pMOS and nMOS are 0.2 μm and 0.3 μm, respectively. Thus, the source and drain thicknesses are much larger than the emitter thickness.

SUMMARY OF THE INVENTION

It is the object of the present invention to eliminate the above-mentioned drawbacks of the prior art and provide a semiconductor device manufacturing method capable of forming a BiCMOS device of a high integration density easily in a relatively simple process.

In the present invention, in order to achieve the above-mentioned object, source and drain regions of MOS transistors are formed after the formation of an emitter of a bipolar transistor, whereby a BiCMOS having the characteristic of xj(MOS) ≦ xjE(Bip) ≦ 0.15 μm can be formed easily.

Generally, if the impurity diffusion coefficient and diffusion time in silicon are D and t, respectively, the depth of doped region, xj, is expressed as $\sqrt{DX}$. And if the constant of proportion is $D_o$, absolute temperature is T, Boltzman constant is k and activation energy is E, the diffusion coefficient D is expressed as $$D = D_o \exp\left(-\frac{E}{KT}\right).$$

That is, assuming that the diffusion time is constant, the lower the heat treatment temperature, the smaller the xj.

With increase in the integration density of semiconductor devices, it is necessary to attenuate both MOS transistor and bipolar transistor. However, if a MOS transistor is attenuated by the prior art, there will occur contact between source, drain regions and a depletion layer, thus causing punch through. Therefore, in proportion to the reduction in planar size of transistors, it is necessary to make xj smaller to thereby prevent the expansion of the depletion layer. To this end, it is absolutely necessary to reduce the heat treatment temperature to thereby prevent the increase of xj.

On the other hand, since the characteristics of a bipolar transistor depend on an impurity distribution in the vertical direction, it is scarcely necessary to make xj so small as xj(MOS). Further, if the heat treatment temperature is reduced, it becomes difficult to control the base width, resulting in variations in the characteristics of bipolar transistors. Consequently, it becomes difficult to form bipolar transistors which are uniform in characteristics.

More particularly, according to the planar technology presently adopted generally, an emitter is formed after the formation of a base, so the base width depends on the difference in depth of the two. However, if the heat treatment temperature is set lower than 850° C., the difference between the diffusion coefficient of boron contained in the base and that of arsenic contained in the emitter becomes larger, resulting in that the base width (vertical spacing between the emitter and the collector) becomes larger and the transistor characteristics are deteriorated. Thus, in the manufacture of bipolar transistors, it is not desirable to set the heat treatment temperature excessively low. In view of this point, in the present invention, an emitter of a bipolar transistor is formed by heat treatment at a temperature of 900° C. or higher and thereafter source and drain regions of MOS transistors are formed by heat treatment at a temperature of 850° C. or lower, whereby the base width ca be controlled with a high accuracy and it is possible to obtain a BiCMOS LSI having high integration density and high performance. Besides, the formation of sufficiently shallow source and drain can be effected. Moreover, by satisfying the relation xj(MOS) ≦ xjE(Bip) ≦ 0.15 μm, it is possible to form both an extremely fine MOS transistor and a high-performance bipolar transistor at a time. Further, with attenuation, it is necessary to thin a gate oxide film of the MOS transistor. The thickness of the gate oxide film is about 25 nm, but in future it will surely become as thin as 10 nm or smaller. In the present invention, a MOS transistor is formed after the formation of a bipolar transistor, whereby the quality of the gate oxide film is improved to a remarkable extent and it is possible to realize a thin film of 10 nm or less and form a BiCMOS LSI having high integration density and high performance.

By forming source and drain regions of the MOS transistors after the formation of an emitter of the bipolar transistor, the heat treatment temperature in the formation of the MOS transistors can be made lower than that in the emitter formation. So it is easy to make xj(MOS) smaller than xjE(Bip), even to a value of 0.13 μm or smaller. Further, by satisfying the relation xj(MOS) ≦ xjE(Bip) ≦ 0.15 μm, both attenuation and the improvement of integration density can be realized while maintaining xjE(Bip) to 0.15 μm or less.

DETAILED DESCRIPTION OF THE PREFERRED EMBODIMENTS

Embodiment 1

Figure 2:
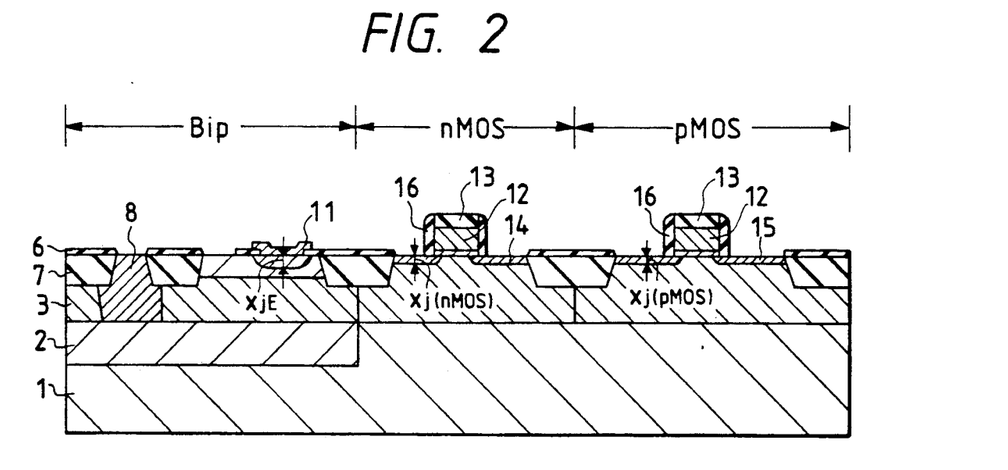
FIGS. 2 to 6 are process charts showing an embodiment of the present invention.

In this embodiment the present invention was applied to the production of a BiCMOS having the sectional structure illustrated in FIG. 2.

Figure 3:
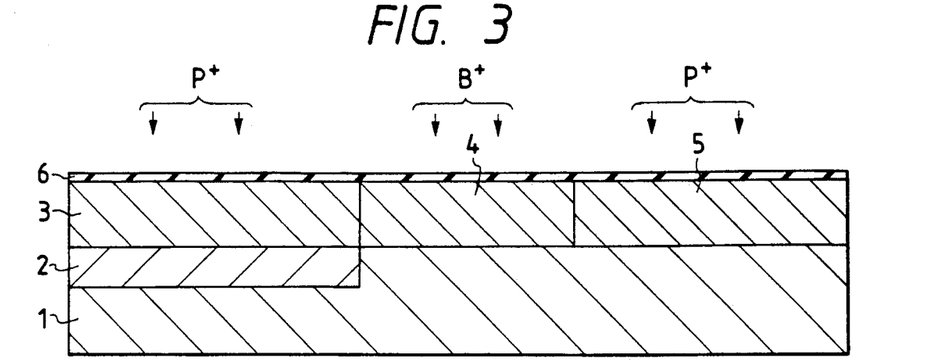
Figure 4:
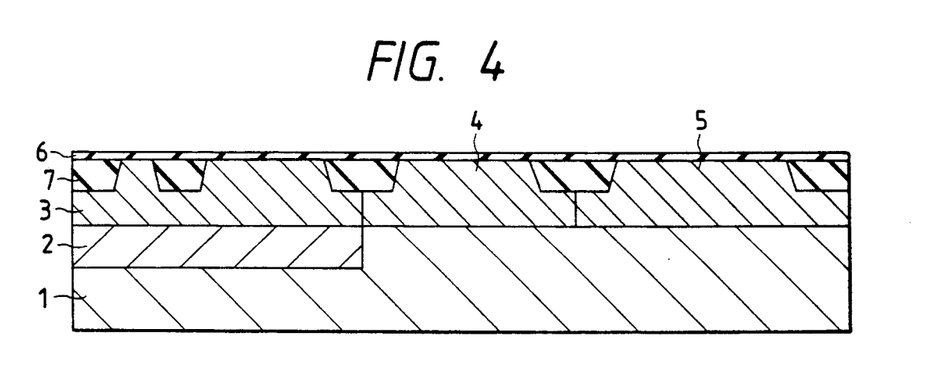
Figure 5:
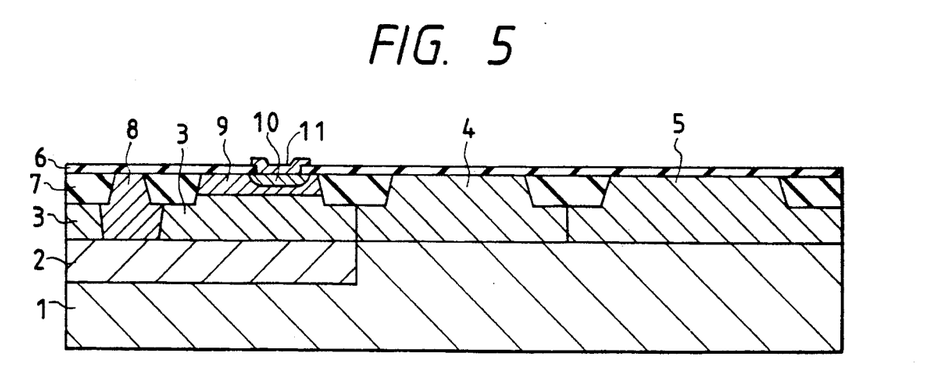
Figure 6:
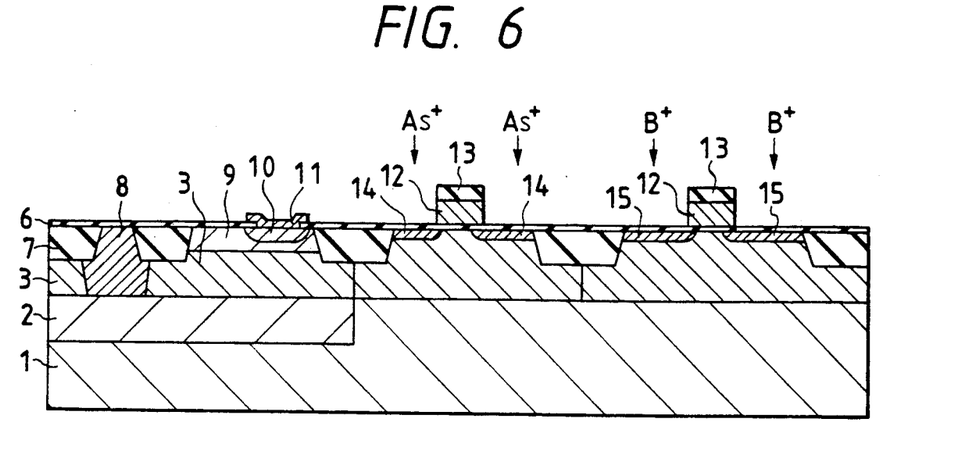
Figure 7:
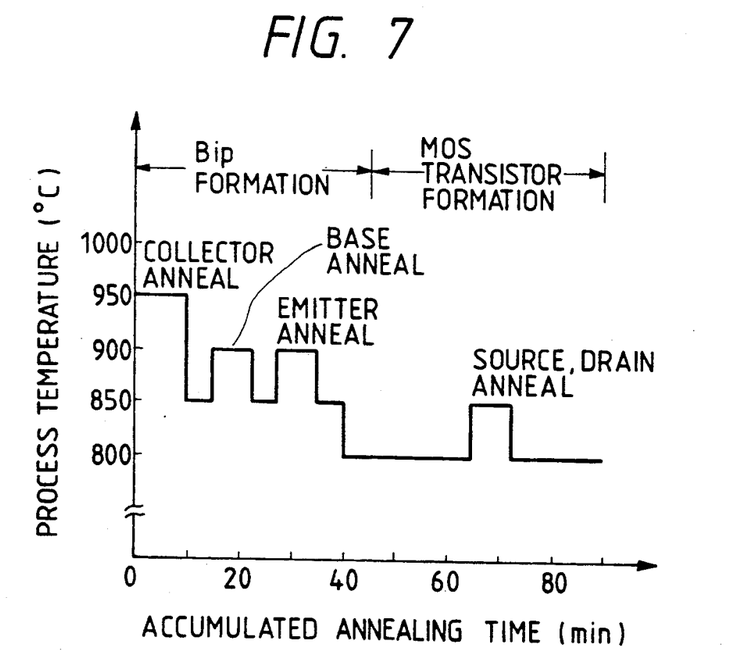
FIG. 7 is a graph showing changes in time and temperature of a series of annealing operations performed in the present invention.

First, as shown in FIG. 3, an n-type buried layer 2 is formed in part of a p-type silicon base 1 by a known ion implantation method, and an epitaxial layer is allowed to grow on the whole surface by a known epitaxial growing method. Next, a silicon dioxide film 6 is formed on the epitaxial layer, and phosphorus is implanted through the silicon dioxide film 6 into the portions where Bip and pMOS are to be formed, while boron is implanted in the portion where nMOS is to be formed, to thereby form N wells 3, 5 and p well 4, respectively. Next, according to a known selective oxidation method using a silicon nitride film as a mask, there is formed a silicon dioxide film 7 for element isolation, as shown in FIG. 4. Thereafter, as shown in FIG. 5, phosphorus is implanted into the portion which is to serve as a collector lead-out portion, followed by heat treatment at 950° C. to form an n-type region 8. Further, boron is implanted into the portion which is to serve as a base region, followed by heat treatment at 900° C. to form a p-type base 9. Next, an opening is formed in part of the silicon dioxide film 6, and an n+-type polycrystalline silicon film 11 which contains a high concentration of impurity is formed therein, followed by heat treatment at 900° C. to form an n+-type emitter 10. Then, as shown in FIG. 6, a gate electrode is formed by an n-type polycrystalline silicon film 12, and a silicon dioxide film 13 is formed thereon. Further, arsenic and boron are implanted in the portions where nMOS and pMOS are to be formed, respectively, followed by heat treatment at 850° C. to form n+-type source, drain 14 and p−-type source, drain 15, respectively. Lastly, as shown in FIG. 2, a silicon dioxide film 16 is formed on the side walls of the gate electrode 12 to complete the BiCMOS LSI illustrated in FIG. 2 which has MOS transistors of a single drain structure. FIG. 7 shows changes of the heat treatment temperature in this embodiment. Since the MOS transistor is formed after the formation of the bipolar transistor, the annealing for forming source and drain of the MOS transistor is performed after the high-temperature annealing for forming the emitter of the bipolar transistor. Thus, the source and drain formation is not followed by the high-temperature annealing and hence it is possible to realize xj(pMOS) = 0.13 μm and xjE(Bip) = 0.15 μm. Actually, the relation xj(MOS) ≦ xjE(Bip) ≦ 0.15 μm was satisfied, and it was also possible to reduce xj(MOS) to 0.12 μm or less.

Figure 8:
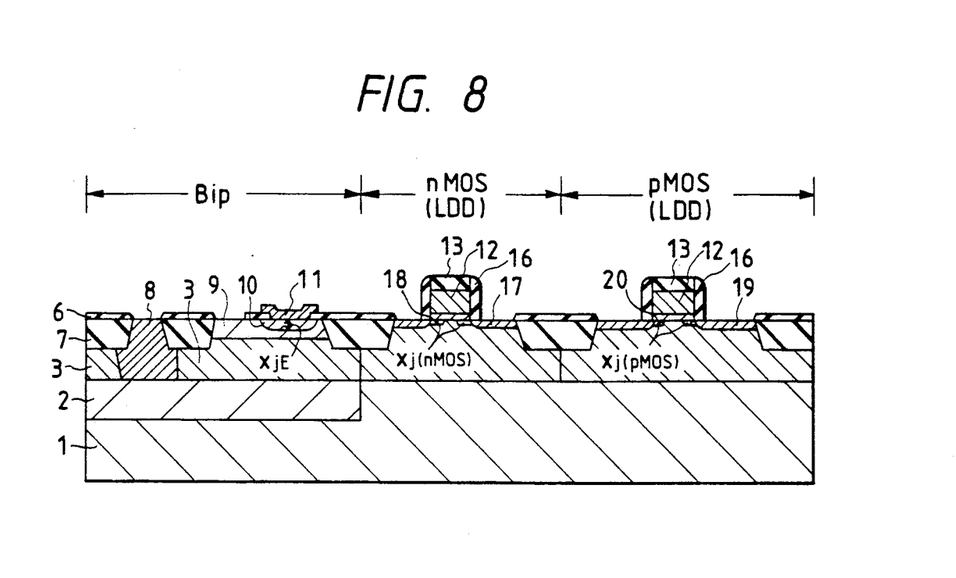
FIG. 8 is a sectional view showing an example of a principal portion of a BiCMOS formed according to the present invention.

FIG. 8 shows a sectional structure of a BiCMOS formed according to the present invention and having LDD (lightly doped drain) type MOS transistors. This structure was obtained by forming the BiCMOS shown in FIG. 2 having MOS transistors of a single drain structure and subsequently forming deep portions 17, 19 of source and drain by additional boron ion implantation. In the LDD type MOS transistors, unlike the single drain type MOS transistors, the source and drain have both thin portions 18, 20 and deep portions 17, 19, as shown in FIG. 8. Therefore, the width of the gate electrode 13 can be made small while effectively preventing the drop of threshold voltage and short-circuit between source, drain electrodes (not shown) and the semiconductor substrate. This is extremely effective in improving the integration density. Also in this case, since the MOS transistors are formed after the formation of the bipolar transistor, there was satisfied the relation xj(MOS) ≦ xjE(Bip) ≦ 0.15 μm. The xj(MOS) represents the thickness of the thin portions 18, 20 of the source and drain. Also in the prior art, it is possible to make xj(MOS) smaller than xjE(Bip) by adjusting the acceleration voltage at the time of ion implantation. As previously noted, however, since in the prior art a bipolar transistor is formed after the formation of MOS transistors, there is performed a heat treatment at 900° C. or higher to form an emitter after the formation of source and drain, so it is difficult to form source and drain not larger than 0.20 μm in thickness and is difficult to obtain a high-performance MOS transistor. Besides, xjE(Bip) must be made very large in order to hold the relation xj(MOS) < xjE(Bip). But if xjE(Bip) is larger than 0.15 μm, the direct current and alternating current characteristics of the bipolar transistor will be deteriorated markedly, so it becomes impossible to obtain a high-performance BiCMOS.

In connection with this embodiment, it goes without saying that whether nMOS and pMOS are formed to have LDD structure and single drain structure, respectively, or conversely they are formed to have single drain structure and LDD structure, respectively, the present invention is applicable to both. Further, although the p-type silicon substrate 1 was used in this embodiment, it goes without saying that an n-type silicon substrate 1 is also employable.

Embodiment 2

Figures 9A, 9B:
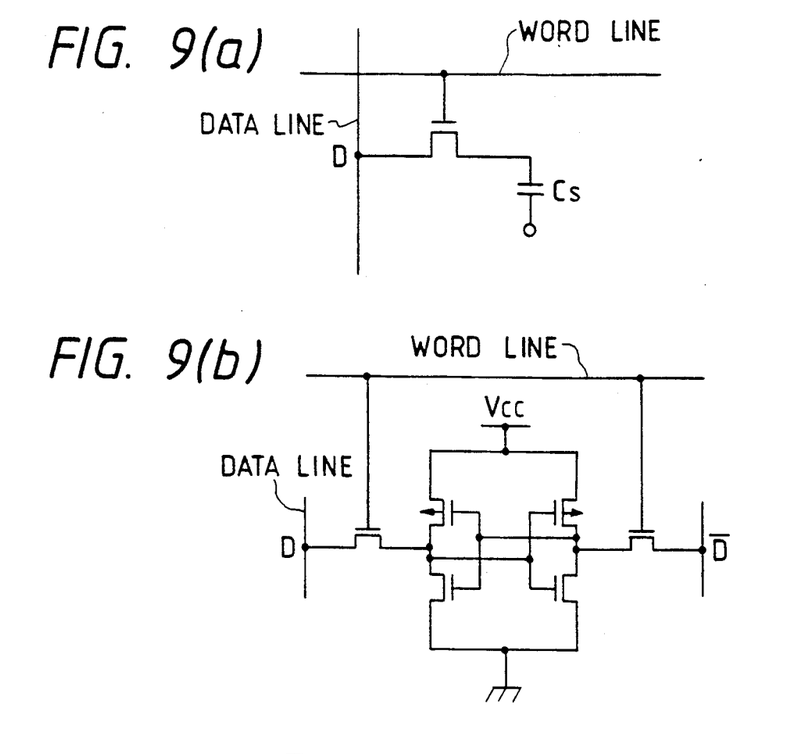
FIGS. 9(a) and 9(b) are diagrams explanatory of a memory cell used in the BiCMOS formed by the present invention.

A second embodiment of the present invention will now be described with reference to FIGS. 9 to 17. In this embodiment, the present invention is applied to the formation of a BiCMOS having a dynamic memory cell (one transistor + one capacitor) which is illustrated in FIG. 9(a). Of course, the present invention is also applicable to the formation of a BiCMOS having a static memory cell which is shown in FIG. 9(b). Further, without being limited to BiCMOS LSI having a read-only memory cell, the present invention is widely applicable to the formation of BiCMOS LSI's each having both MOS transistor and bipolar transistor in a chip. In this embodiment there is illustrated a BiCMOS DRAM in which a memory cell includes nMOS, and a peripheral circuit is composed of pMOS and Bip. But the present invention is also applicable to a BiCMOS including a DRAM memory cell in which a memory cell is composed of plural nMOS's and pMOS's, and a peripheral circuit is composed of plural nMOS's and pMOS's.

Figure 10:
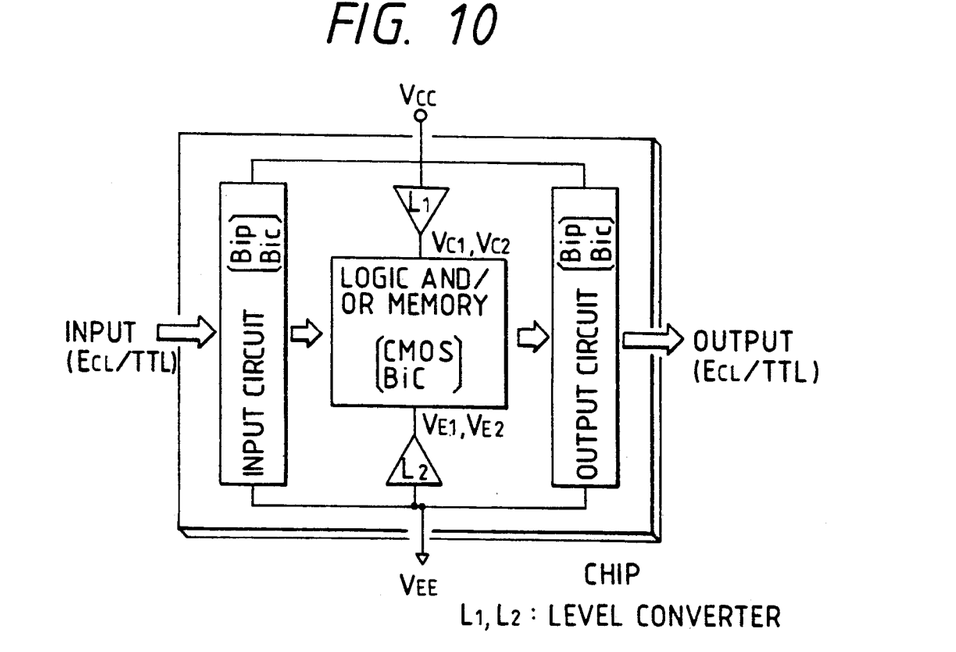
FIG. 10 is a diagram for explaining the construction of the said BiCMOS.
Figure 11:
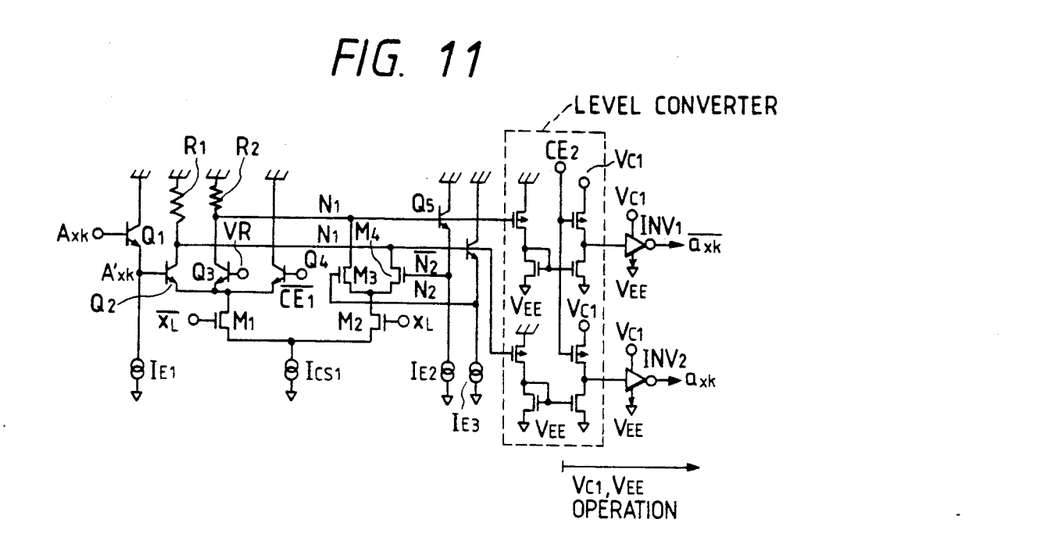
FIGS. 11 and 12 are circuit diagrams respectively showing an example of an input circuit and that of an output circuit in an ECL interface of a BiCMOS circuit formed by the present invention.
Figure 12:
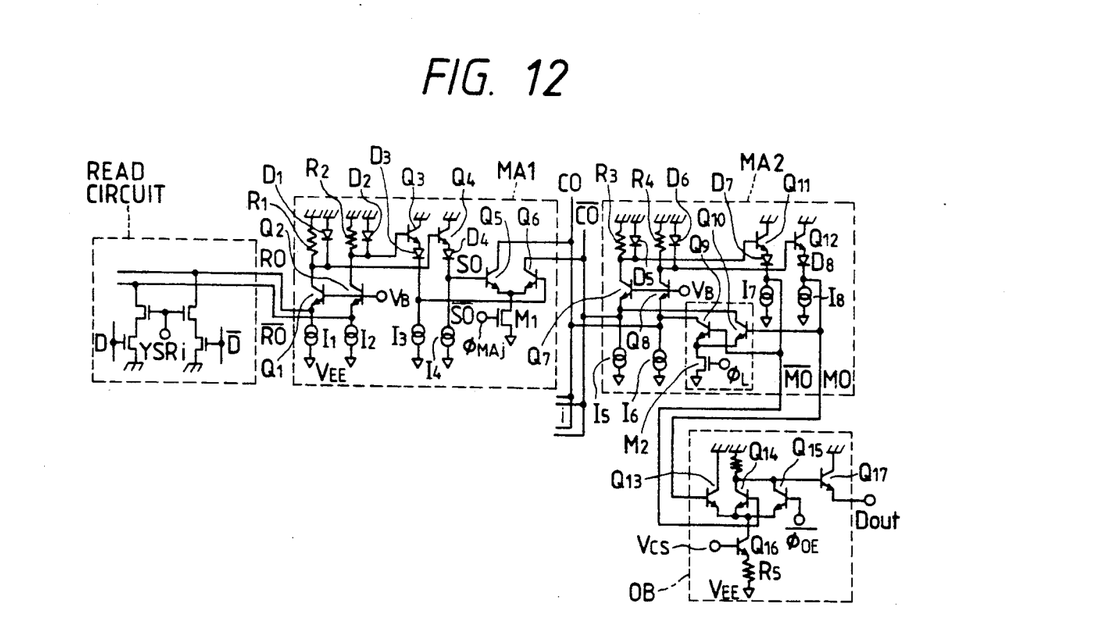

Referring first to FIGS. 10 to 12, there is shown an example of a BiCMOS circuit produced according to the present invention. FIG. 10 shows an entire chip construction, FIG. 11 shows an input circuit of an ECL interface, and FIG. 12 shows an output circuit thereof. In FIG. 10, at a voltage dropped lower than the source voltage by a voltage drop circuit $L_1$ or $L_2$, a memory cell using a fine MOS transistor not larger than 0.5 μm in gate length, or a logical circuit such as decoder, is operated. In the input and output circuits there is performed level change between external ECL or TTL signals and intra-chip signals. In this way a high-speed BiCMOS LSI can be constituted at a high integration density while using the same input-output interface as in the prior art. Of course, a CMOS interface is employable as the input-output interface. Where the source voltage is lower than the withstand voltage of the fine MOS, a BiCMOS LSI may be constituted under the omission of the voltage drop circuits $L_1$ and $L_2$ shown in FIG. 10.

Figure 13:
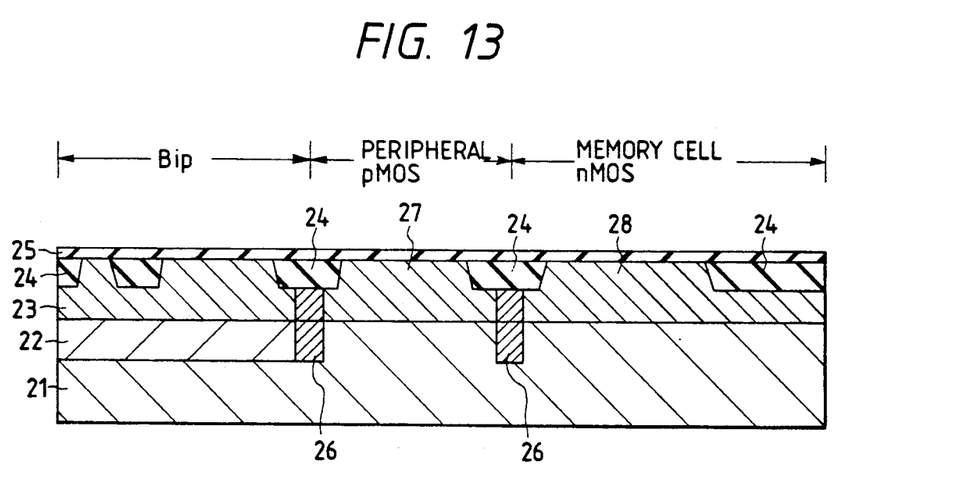
FIGS. 13-16 and FIGS. 17(a)-17(c) are process charts and partially enlarged views, respectively, showing another embodiment of the present invention.
Figure 14:
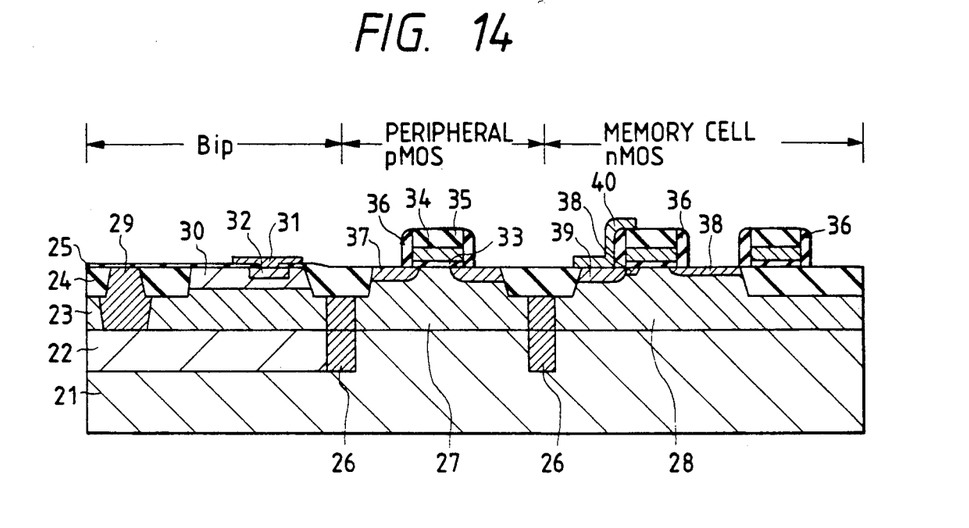

Now, an example of how to manufacture the above semiconductor device will be described with reference to FIGS. 13 to 16. First, as shown in FIG. 13, an n-type impurity doped region 22 and a p-type impurity doped region 26 are formed in part of a p-type silicon substrate 21, thereafter an epitaxial layer is allowed to grow by a known epitaxial growth method. Then, n-wells 23, 27 and p-well 28 are formed using an ion implantation method and subsequently a thick silicon dioxide film 24 for element isolation is formed by selective oxidation. Thereafter, a silicon dioxide film 25 is formed over the whole surface. Next, as shown in FIG. 14, an n+-type region 29 for collector lead-out is formed by an ion implantation method, followed by formation of a p-type region 30 which serves as a base. Then, gate electrodes are formed in the peripheral pMOS and the memory cell nMOS. First, part of the silicon dioxide film 25 is removed and a gate oxide film 33 is formed by a known thermal oxidation method. The film thickness was set at about 6.5 nm. Thereafter, an n-type polycrystalline silicon film 34 and a silicon dioxide film 35 were formed by deposition, and unnecessary portions of these two films were removed using the photolithography technique and the dry etching technique to form a gate electrode. In this embodiment, the gate length of nMOS and that of pMOS are 0.3 μm and 0.4 μm, respectively. Next, an n-type polycrystalline silicon film 31 was formed by deposition and unnecessary portions were removed by patterning, followed by heat treatment at 900° C. to form an n-type region 32 serving as an emitter of Bip. Then, source and drain regions 38 of the nMOS are formed by a known ion implantation method. Further, a side spacer 36 formed by a silicon dioxide film is provided on the side faces of the gate electrode in each of the nMOS and pMOS. Thereafter, an n-type polycrystalline silicon film 40 is formed by deposition and patterning is performed to provide an n-type region 39. Further, p-type source and drain regions 37 of the pMOS were formed by known ion implantation and heat treatment. By so doing, the xj(MOS) of the nMOS can be made smaller than that of the bipolar xjE(Bip), and further shortening of the MOS transistor channel could be realized.

Figure 15:
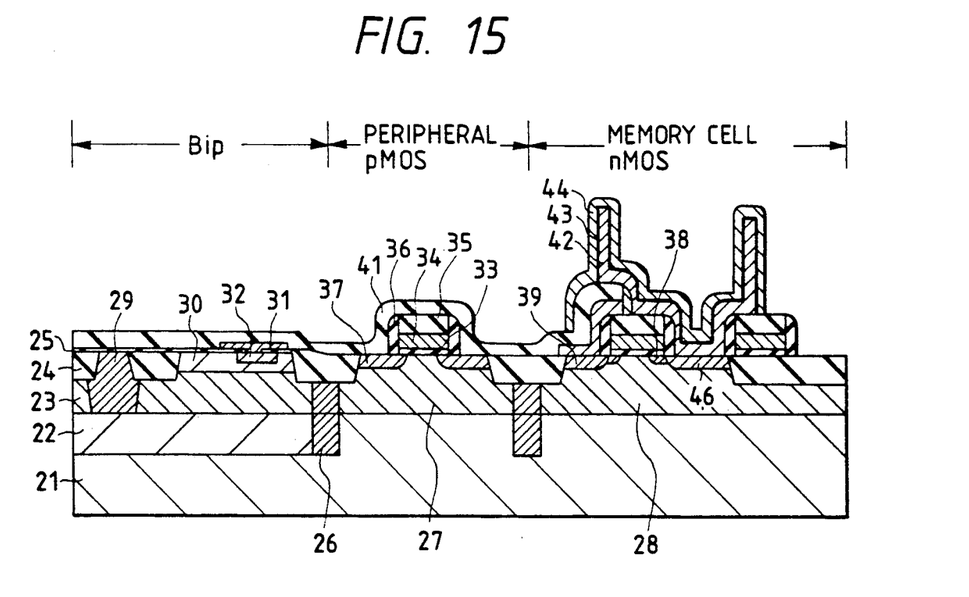
Figure 16:
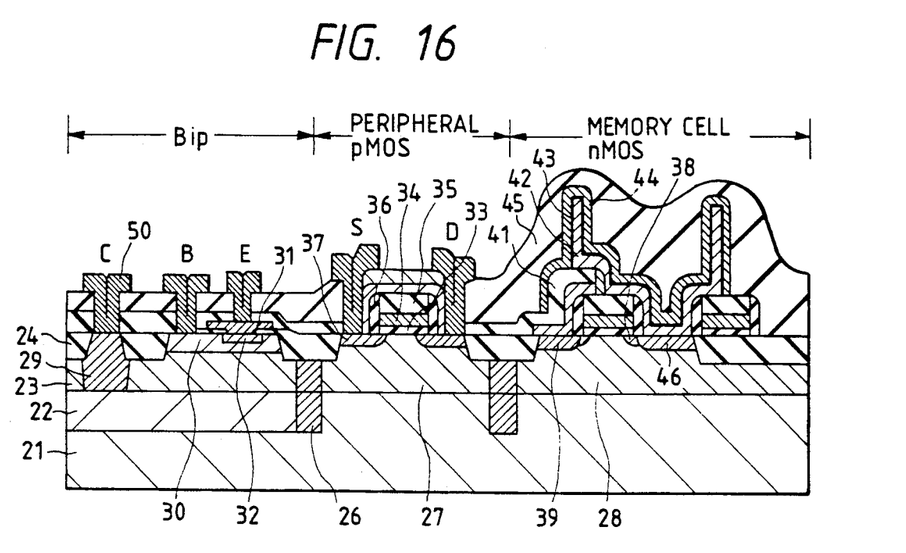
Figure 17A:
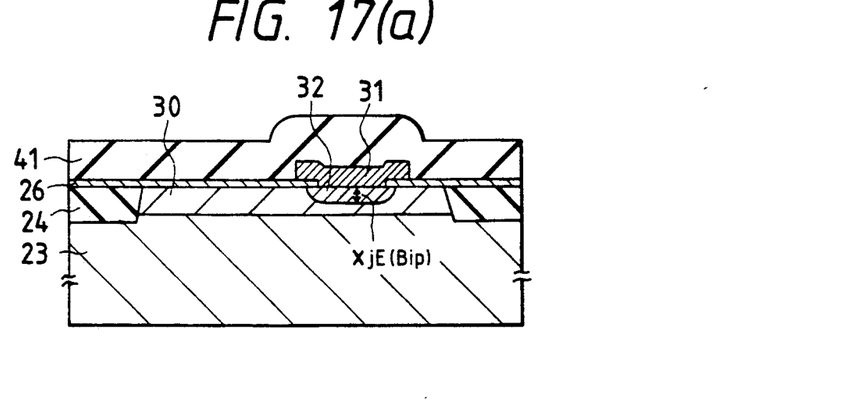
Figure 17B:
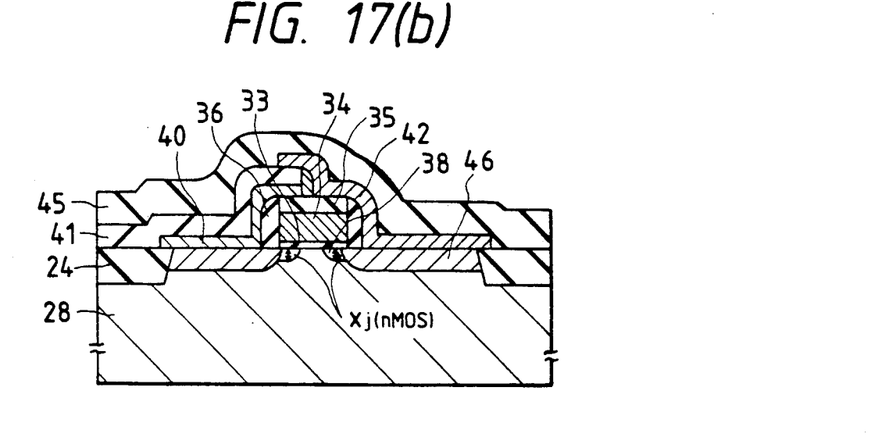
Figure 17C:
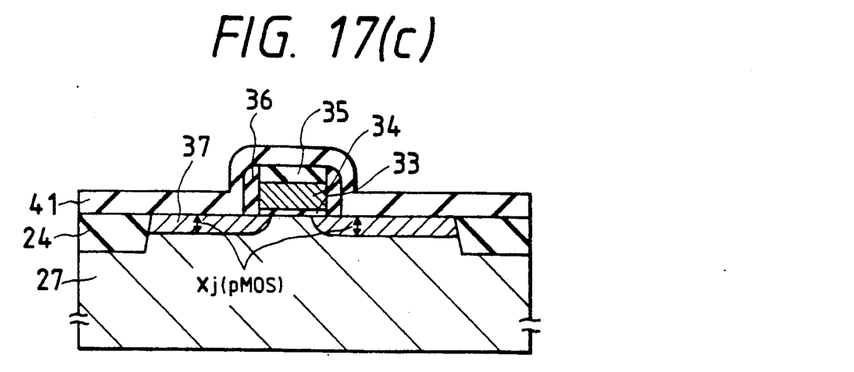

Next, as shown in FIG. 15, a silicon dioxide film 41 is formed on the whole surface by deposition, then the portion of the silicon dioxide film 41 deposited on the memory cell portion is removed by a known selective etching method, and thereafter an n-type polycrystalline silicon film 42 is formed, followed by heat treatment at 850° C. to form an n-type doped region 46. Next, an insulating film 43 and a metallic interconnection 44 are formed on the n-type polycrystalline silicon film 42 to constitute a capacitor. Although in this embodiment tantalum pentoxide and tungsten are used as the materials of the insulating film 43 and the metallic interconnection 44, respectively, it goes without saying that other materials may be used for them. Next, as shown in FIG. 16, a silicon dioxide film 45 is formed by deposition, followed by formation of contact holes and electrodes to complete a contact hole BiCMOS LSI. FIGS. 17(a), (b) and (c) are enlarged views of (a) Bip portion, (b) memory cell nMOS portion and (c) peripheral pMOS portion, respectively, which are main components of the above BiCMOS LSI. Since the source and drain regions of the MOS transistors were formed after the formation of the Bip emitter, there were obtained the values of xjE(Bip) = 0.12 μm, xj(nMOS) = 0.10 μm and xj(pMOS) = 0.12 μm. Thus, xj(MOS) ≦ xjE(Bip) ≦ 0.15 μm could be realized and the BiCMOS obtained was extremely superior in characteristics. The numeral 50 in FIG. 16 denotes a metallic electrode.

Embodiment 3

Figure 18:
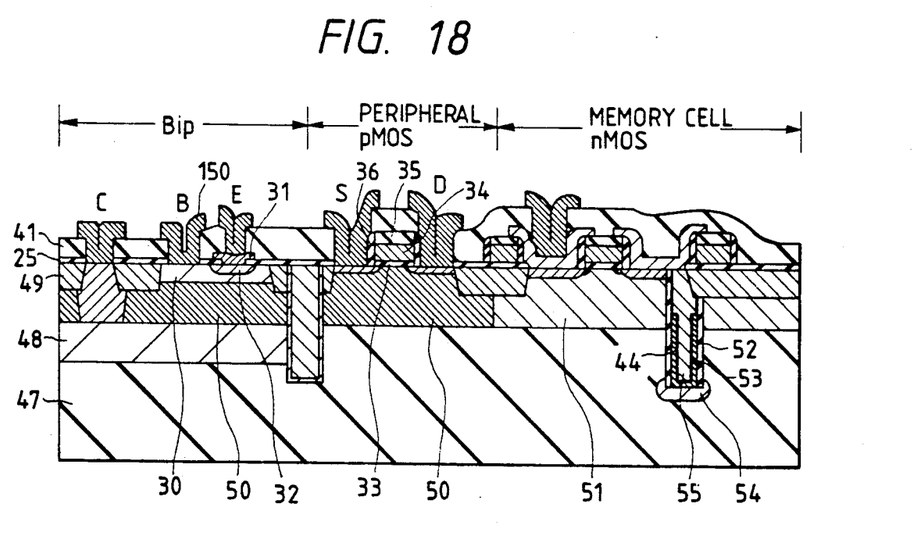
FIG. 18 is a partially sectional view showing a further embodiment of the present invention.

A third embodiment of the present invention is illustrated in FIG. 18. In this embodiment, the present invention is applied to a dynamic memory cell in which an electric charge is stored in a capacitor constituted by utilizing a trench formed in a silicon substrate. More specifically, an electric charge is stored in a capacitor composed of the metallic interconnection 44, an insulating film 53 and an n-type polycrystalline silicon 55. In this embodiment, the trench for the capacitor can be used in common to an isolation trench of a bipolar transistor. Consequently, a parasitic capacitor of the bipolar transistor can be reduced and so it is possible to realize a BiCMOS LSI of higher performance.

It goes without saying that in the above embodiments 1 to 3, even if all of the n- and p-type regions are reversed, the present invention is applicable to that case.

In the formation of an LSI according to the present invention, as set forth above, there could be formed at a time without increase in the number of processes a bipolar transistor having an emitter depth of xjE(Bip) = 0.12 μm, an emitter area of 0.5×4.0 μm², a current gain of 100 and a cut-off frequency of 10 GHz, an nMOS having a gate length of 0.3 μm and xj(nMOS) = 0.10 μm, and a pMOS having a gate length of 0.4 μm and xj(pMOS) = 0.12 μm. Further, if a 4 Mbit BiCMOS DRAM is formed using the above transistors, there are attained a memory cell area of 1.28 μm² and an access time of 7 ns, and it is possible to obtain a circuit velocity five times as high as the conventional CMOS DRAM. According to the present invention, moreover, it is possible to realize a high-speed memory LSI of high integration density such as, for example, a 64 Mbit BiCMOS DRAM, or a 16 Mbit BiCMOS DRAM, having an access time of not longer than 20 ns. Additionally, the present invention is applicable not only to memory LSI's but also widely to various BiCMOS LSI's, including ordinary logical LSI's and LSI's containing analog circuits.

What is claimed is:

1. A method for manufacturing a semiconductor device having bipolar and MOS transistors, including the steps of:
   (a) selectively doping predetermined portions of a surface region of a semiconductor substrate with an impurity having a first conductivity type and an impurity having a second conductivity type opposite to said first conductivity type to form a first well region in which the bipolar transistor is to be formed, a second well region having said first conductivity type and a third well region having said second conductivity type;
   (b) doping the surface region of said first well region with said impurity to form a base having a conductivity type opposite to that of said first well region;
   (c) forming a polycrystalline silicon film having a predetermined pattern and containing a large amount of impurity of the same conductivity type as that of said first well region on a predetermined portion of the surface of said base, followed by a first heat treatment to diffuse the impurity contained in said polycrystalline silicon film into said base and thereby form an emitter;
   (d) forming an insulating film on the surface of each said second and third well regions;
   (e) forming a gate electrode of an electroconductive film having a predetermined shape on each said insulating film; and
   (f) after said first heat treatment to diffuse the impurity contained in said polycrystalline silicon film to thereby form the emitter, doping predetermined portions of the surface regions of said second and third well regions with the impurities of said second and first conductivity type, respectively, followed by a second heat treatment at a temperature lower than that of said first heat treatment, so as to form sources and drains of the MOS transistors smaller in thickness than that of said emitter.

2. A method according to claim 1, wherein said first and second conductivity types are p-type and n-type, respectively.

3. A method according to claim 2, wherein said first well region is an n-type region and said bipolar transistor is an npn bipolar transistor.

4. a method according to claim 1, wherein said first heat treatment is performed at a temperature of not lower than 900° C.

5. A method according to claim 2, wherein said second heat treatment is performed at a temperature of not higher than 850° C.

6. A method according to claim 1, wherein the thickness of said emitter is not larger than 0.15 μm.

7. A method according to claim 1, wherein said semiconductor device is a BiCMOS having a dynamic memory cell comprising one MOS transistor and one capacitor.

8. A method according to claim 1, wherein said semiconductor device is a BiCMOS having a static memory cell.

9. A method according to claim 1, wherein the formation of said sources and drains is effected by ion implantation using said gate electrodes and insulating films formed thereon as mask and also by said second heat treatment.

10. A method according to claim 1, wherein said step (f) is replaced by the following step (f'):
   (f') ion-implanting impurities of said second and first conductivity type into predetermined portions of the surface region of said second and third well regions, then forming an insulating film on side walls of each said gate electrode, then ion-implanting the impurities of said second and first conductivity type therein, respectively, followed by a heat treatment at a temperature lower than that of said first heat treatment to form sources and drains of MOS transistors partially different in thickness, with the thickness of the thinner portion being smaller than the thickness of said emitter.

11. A method according to claim 1, wherein the first heat treatment is performed at a temperature not lower than 900°C., and the second heat treatment is performed at a temperature of not higher than 850° C.

12. A method according to claim 1, wherein said steps (e) –(f) are performed after said first heat treatment.

13. A method according to claim 1, wherein the electroconductive film, from which the gate electrode is formed, is another polycrystalline silicon film, the another polycrystalline silicon film being a different film than the polycrystalline silicon film having the predetermined pattern.

14. A method according to claim 1, further comprising forming isolation regions, for element isolation, between adjacent well regions.

15. A method according to claim 14, wherein said isolation regions are relatively thick oxide isolation regions.

16. A method according to claim 14, wherein the isolation regions include a trench isolation region.

17. A method according to claim 16, wherein the semiconductor device includes a memory cell having one MOS transistor and one capacitor, the capacitor being a trench capacitor.

18. A method according to claim 1, wherein the first heat treatment to diffuse the impurity contained in the polycrystalline silicon film to thereby form the emitter is performed after forming the base; wherein the impurity doped into the surface region of the first well region is doped by ion implantation; and wherein the electroconductive film from which the gate electrode is formed is a different film than the polycrystalline silicon film having the predetermined pattern.

19. A method according to claim 18, wherein the impurity doped into the surface region of the first well region is boron, and the impurity contained in the polycrystalline silicon film having a predetermined pattern is arsenic.

20. A method according to claim 1, wherein said doping predetermined portions of the surface regions of said second and third well regions is performed by ion implantation.

21. A method for manufacturing a semiconductor device having bipolar and MOS transistors, including the steps of:
(a) forming a polycrystalline silicon film having a predetermined pattern and containing an impurity of the same conductivity type as that of a first region of a semiconductor substrate, on a predetermined portion of a surface of a base of the bipolar transistor of the semiconductor device, the base being of opposite conductivity type to that of the first region, the bipolar transistor being formed in said first region, the semiconductor substrate having at least a second region in which at least one MOS transistor is to be respectively formed;
(b) after forming said polycrystalline silicon film, performing a first heat treatment to diffuse the impurity contained in the polycrystalline silicon film into said base so as to form an emitter region of the bipolar transistor;
(c) forming a gate insulating film and a gate electrode for the at least one MOS transistor, on the at least a second region;
(d) after said first heat treatment to diffuse the impurity contained in the polycrystalline silicon film to thereby form the emitter, doping predetermined portions of the surface regions of the at least a second region in order to form sources and drains of the at least one MOS transistor; and
(e) after said doping predetermined portions of the surface regions of the at least a second region, performing a second heat treatment, at a temperature lower than that of the first heat treatment, the second heat treatment being performed so as to form the sources and drains of the at least one MOS transistor smaller in thickness than that of said emitter.

22. A method according to claim 21, wherein the semiconductor substrate has second and third regions in each of which MOS transistors are to be formed, the second and third regions being of opposite conductivity type to each other, and wherein, in said doping, impurities of opposite conductivity type to each other are doped respectively into the second and third regions so as to form MOS transistors, of opposite conductivity type, respectively in the second and third regions, whereby complementary MOS transistors are formed in the second and third regions.

23. A method according to claim 21, wherein said doping predetermined portions of the surface regions of the at least a second region is performed by ion implantation.

24. A method according to claim 21, wherein the thickness of said emitter is not larger than 0.15 $\mu$m.

* * * * *